(12) United States Patent
Lee

(10) Patent No.: US 12,424,536 B2
(45) Date of Patent: Sep. 23, 2025

(54) PACKAGING STRUCTURE WITH EMBEDDED POWER CHIP AND CIRCUIT BOARD MODULE HAVING THE SAME

(71) Applicant: BOARDTEK ELECTRONICS CORPORATION, Taoyuan (TW)

(72) Inventor: Chien-Cheng Lee, New Taipei (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 528 days.

(21) Appl. No.: 17/824,025

(22) Filed: May 25, 2022

(65) Prior Publication Data

US 2023/0343694 A1 Oct. 26, 2023

(30) Foreign Application Priority Data

Apr. 21, 2022 (CN) .......................... 202210423555.1

(51) Int. Cl.
*H01L 23/498* (2006.01)
*H01L 23/00* (2006.01)
(Continued)

(52) U.S. Cl.
CPC .. *H01L 23/49844* (2013.01); *H01L 23/49811* (2013.01); *H01L 23/49822* (2013.01); *H01L 24/32* (2013.01); *H01L 24/33* (2013.01); *H01L 24/48* (2013.01); *H01L 24/73* (2013.01); *H01L 25/072* (2013.01); *H05K 1/0209* (2013.01);
(Continued)

(58) Field of Classification Search
None
See application file for complete search history.

(56) References Cited

U.S. PATENT DOCUMENTS

| | | | |
|---|---|---|---|
| 2012/0146133 A1* | 6/2012 | Hirler | H01L 23/481 257/330 |
| 2015/0064844 A1* | 3/2015 | Mahler | H01L 24/24 438/107 |

(Continued)

FOREIGN PATENT DOCUMENTS

| | | |
|---|---|---|
| CN | 104900634 A | 9/2015 |
| CN | 111261596 A | 6/2020 |

(Continued)

OTHER PUBLICATIONS

Machine Translation of JP-2019119349-A, Multilayer wiring board (Year: 2019).*

*Primary Examiner* — Sue A Purvis
*Assistant Examiner* — Fakeha Sehar
(74) *Attorney, Agent, or Firm* — ScienBiziP, P.C.

(57) ABSTRACT

A packaging structure and a circuit board having the packaging structure are provided. The packaging structure includes a power chip, a wire, a grid terminal, a first soldering layer, a second soldering layer, a first frame, a second frame, and a packaging body. The power chip has a grid electrode, a source electrode, and a drain electrode. The grid terminal is connected to the grid electrode through the wire. The first frame is connected to the source electrode through the first soldering layer. The second frame is connected to the drain electrode through the second soldering layer. The packaging body covers the power chip, the grid terminal, the first frame, the second frame, the wire, the first soldering layer and the second soldering layer.

7 Claims, 11 Drawing Sheets

(51) Int. Cl.
    *H01L 25/07*     (2006.01)
    *H05K 1/02*      (2006.01)
    *H05K 1/11*      (2006.01)

(52) U.S. Cl.
    CPC .............. *H05K 1/116* (2013.01); *H01L 24/45* (2013.01); *H01L 2224/32245* (2013.01); *H01L 2224/33181* (2013.01); *H01L 2224/45124* (2013.01); *H01L 2224/45144* (2013.01); *H01L 2224/48245* (2013.01); *H01L 2224/73215* (2013.01); *H01L 2224/73265* (2013.01); *H01L 2924/30107* (2013.01); *H05K 2201/10166* (2013.01)

(56) References Cited

U.S. PATENT DOCUMENTS

| | | | | |
|---|---|---|---|---|
| 2016/0111346 A1* | 4/2016 | Hoeglauer | .......... | H01L 23/3135 |
| | | | | 257/685 |
| 2022/0208629 A1* | 6/2022 | Jeong | .................. | H01L 23/3135 |
| 2022/0232694 A1* | 7/2022 | Lu | ........................ | H05K 1/0222 |

FOREIGN PATENT DOCUMENTS

| | | | | |
|---|---|---|---|---|
| JP | 2019110349 A | * | 7/2019 | ........... H01L 23/142 |
| TW | 201444031 A | | 11/2014 | |

* cited by examiner

PACKAGING STRUCTURE WITH EMBEDDED POWER CHIP AND CIRCUIT BOARD MODULE HAVING THE SAME

FIELD

The disclosure relates to field of circuit board manufacturing, and more particularly, to a packaging structure and a circuit board module having the packaging structure.

BACKGROUND

Electronic devices, such as power chips, may be attached to circuit boards. During manufacturing, the power chip is placed on and electrically connected to a frame by gold wires or aluminum wires. Then, the frame having the power chip is subjected to injection molding to form a packaging assembly. Then, the packaging assembly is attached to the circuit board by soldering, thereby forming a packaging structure. However, such the packaging structure may produce a high parasitic inductance, and may have a large power loss during high-speed switching. Improvement in the art is desired.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Figure 1:
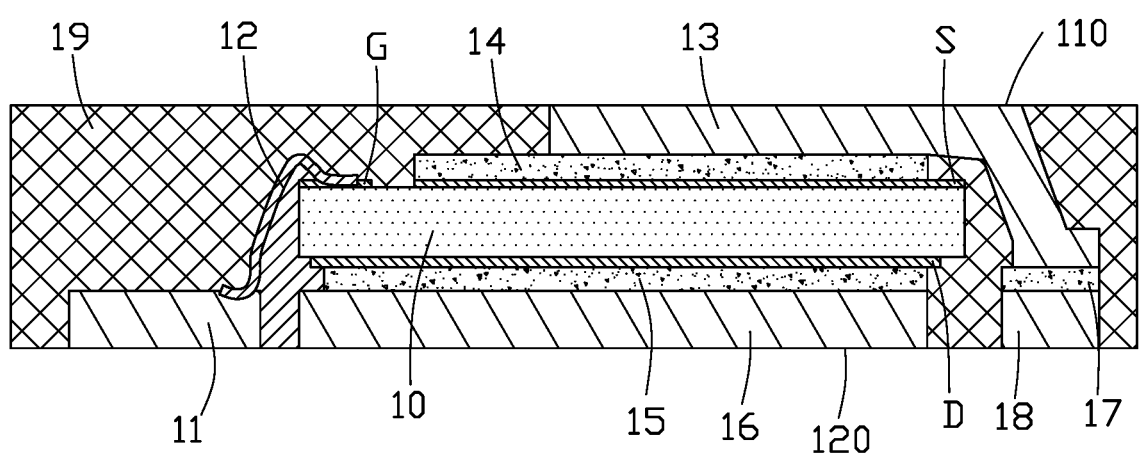
FIG. 1 is a cross-sectional view of a package structure according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, a packaging structure 100 is provided according to an embodiment of the present disclosure. The packaging structure 100 may be a power semiconductor for power processing, such as frequency conversion, voltage transformation, and current transformation. The packaging structure 100 includes a power chip 10, a grid terminal 11, a wire 12, a first frame 13, a first soldering layer 14, a second soldering layer 15, a second frame 16, a third soldering layer 17, and a packaging body 19.

The power chip 10 has a gate electrode a source electrode S, and a drain electrode D. The gate terminal 11 is connected to the gate electrode G through the wire 12. The first frame 13 is connected to the source electrode S through the first soldering layer 14. That is, the first frame 13 functions as a source terminal. The second frame 16 is connected to the drain electrode D through the second soldering layer 15. That is, the second frame 16 functions as a drain terminal. The packaging body 19 covers the power chip 10, the grid terminal 11, the first frame 13, the source terminal 18, and the second frame 16.

In at least one embodiment, the packaging structure 100 further includes a source terminal 18. The source terminal 18 is connected to the first frame 13 through the third soldering layer 17. At this time, the gate terminal 11, the source terminal 18, and the second frame 16 are exposed from a same surface of the packaging structure 100. In detail, the packaging structure 100 includes a first surface 110 and a second surface 120 opposite to the first surface 110. The gate terminal 11, the source terminal 18, and the second frame 16 are exposed from the second surface 120.

In at least one embodiment, one surface of the first frame 13 is exposed from the first surface 110, and the other surface is connected to the source terminal 18.

The power chip 10 may be an insulated gate bipolar transistor (IGBT), a silicon carbide (SIC), or a gallium nitride (GAN). The wire 12 may be a gold wire or an aluminum wire.

In the present disclosure, the source electrode S of the power chip 10 is connected to the first frame 13 by soldering, and the drain electrode D of the power chip 10 is connected to the second frame 16 by soldering. Compared to electrically connecting the electrode to the corresponding frame by wires, the present disclosure increases a connecting area between the source electrode S and the first frame 13 and a connecting area between the drain electrode D and the second frame 16. Thus, the parasitic inductance of the packaging structure 100 is reduced, and power loss generated by the power chip 10 during the high-speed switching is also reduced. In addition, the grid electrode G and the grid terminal 11 are connected by the wire 12, which improves reliability of connection between the grid electrode G and the grid terminal 11 even when the grid electrode G has a small surface. A larger space is retained for the connection between the source electrode S and the first frame 13.

Figure 11:
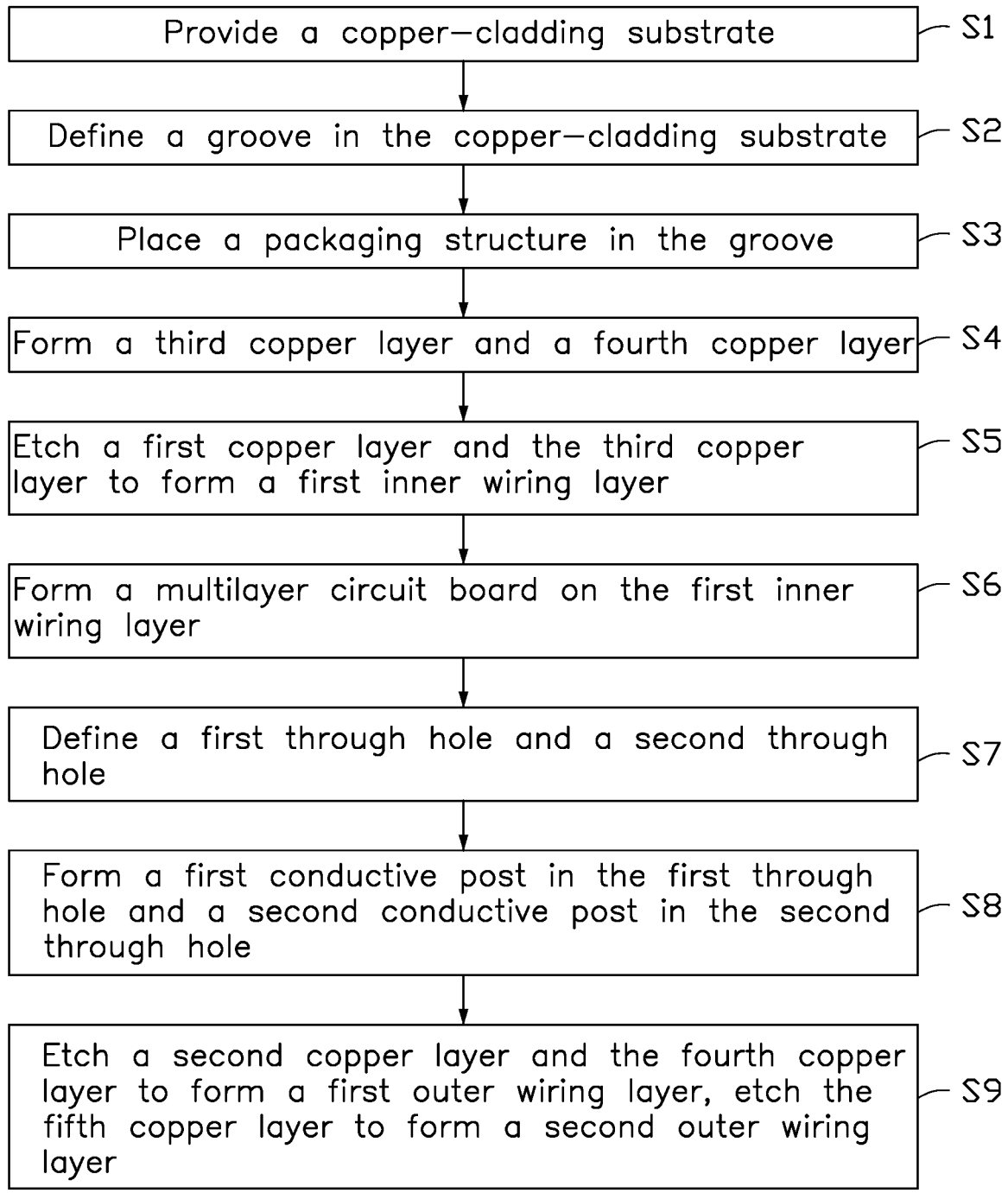
FIG. 11 is a flowchart of a method for manufacturing a circuit board module of FIG. 9.

The present disclosure also provides a method for manufacturing a circuit board module. Referring to FIG. 11, the method is presented in accordance with an embodiment. The method is provided by way of example, as there are a variety of ways to carry out the method. The method can begin at S1.

Figure 2:
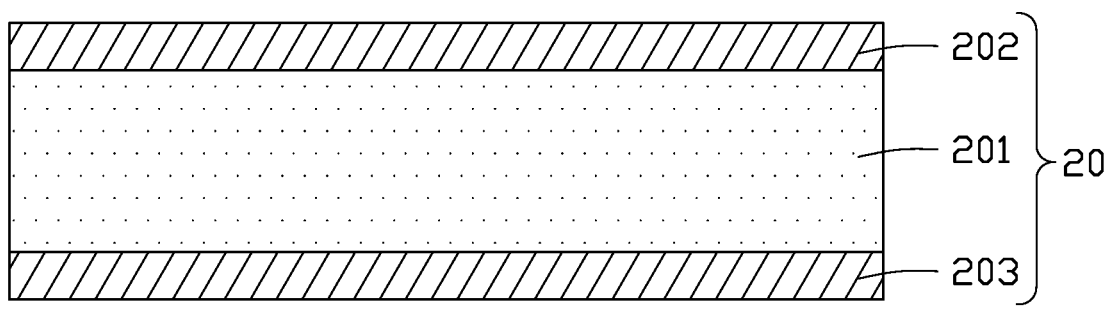
FIG. 2 is a cross-sectional view of a copper-cladding substrate according to an embodiment of the present disclosure.

At step S1, referring to FIG. 2, a copper-cladding substrate 20 is provided, which includes a first base layer 201, a first copper layer 202, and a second copper layer 203. The first copper layer 202 and the second copper layer 203 are formed on opposite surface of the first base layer 201.

Figure 3:
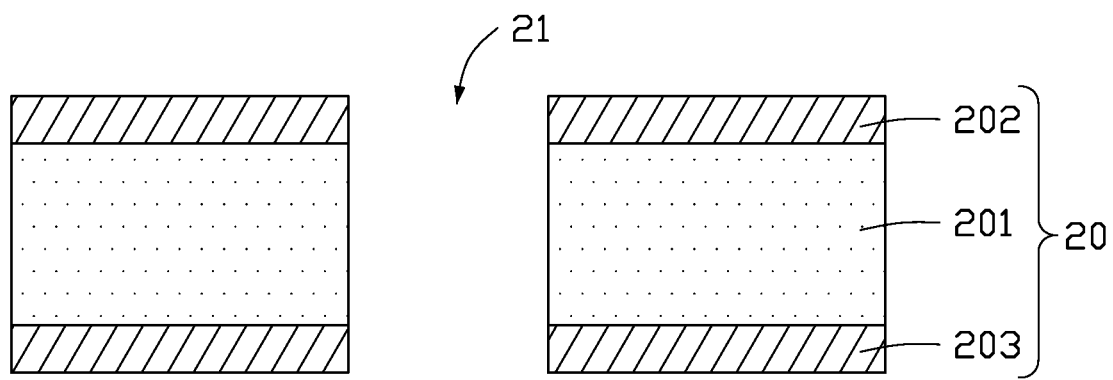
FIG. 3 is a cross-sectional view showing a groove defined in the copper-cladding substrate of FIG. 2.

At step S2, referring to FIG. 3, a groove 21 is defined in the copper-cladding substrate 20. The groove 21 passes through the first base layer 201, the first copper layer 202, and the second copper layer 203.

Figure 4:
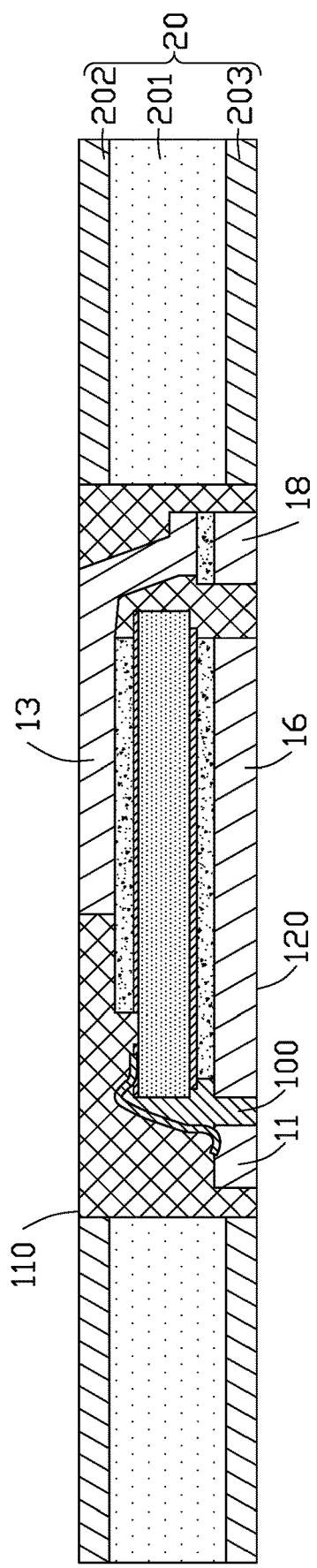
FIG. 4 is a cross-sectional view showing the packaging structure of FIG. 1 placed in the groove of FIG. 3.

At step S3, referring to FIG. 4, the packaging structure 100 is placed in the groove 21.

In at least one embodiment, the first surface 110 is flush with a surface of the first copper layer 202 away from the first base layer 201. The second surface 120 is flush with an opposite surface of the second copper layer 203 away from the first base layer 201.

Before placing the packaging structure 100 in the groove 21, an electrical property of the packaging structure 100 may first be measure to ensure the quality of the power chip 10.

Figure 5:
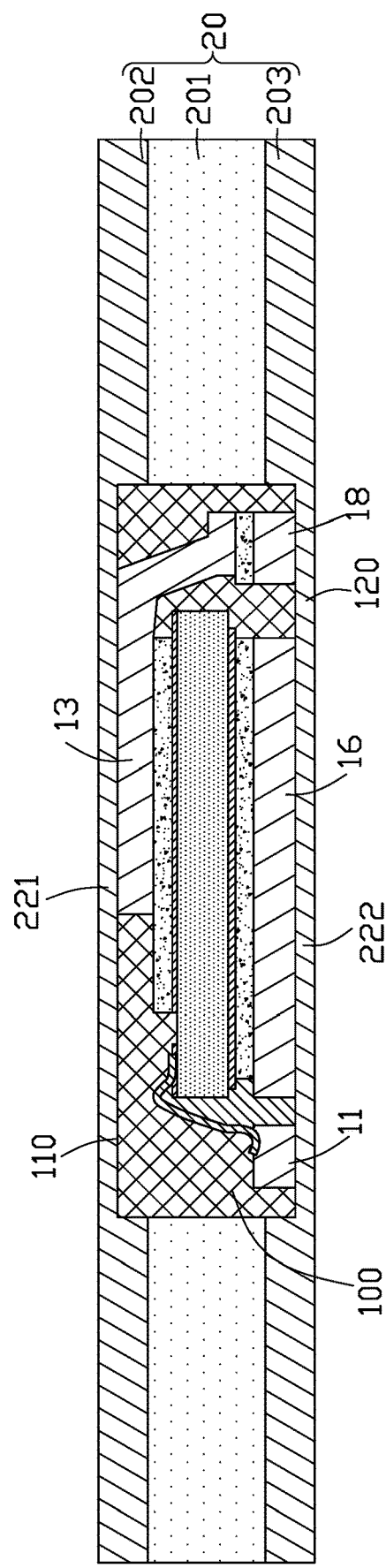
FIG. 5 is a cross-sectional view showing a third copper layer and a fourth copper layer formed on the packaging structure of FIG. 4.

At step S4, referring to FIG. 5, a third copper layer 221 is formed on the first copper layer 202 and the first surface 110 of the packaging structure 100. A fourth copper layer 222 is formed on the second copper layer 203 and the second surface 120 of the packaging structure 100.

In at least one embodiment, before forming the third copper layer 221 and the fourth copper layer 222, a mechanical grinding may first be performed on the first surface 110 and the second surface 120 of the packaging structure 100, which ensures that the surfaces of the first frame 13, the grid terminal 11, the source terminal 18, and the second frame 16 are exposed from the corresponding surfaces.

In at least one embodiment, each of the third copper layer 221 and the fourth copper layer 222 may be formed by chemical plating or electroplating.

Figure 6:
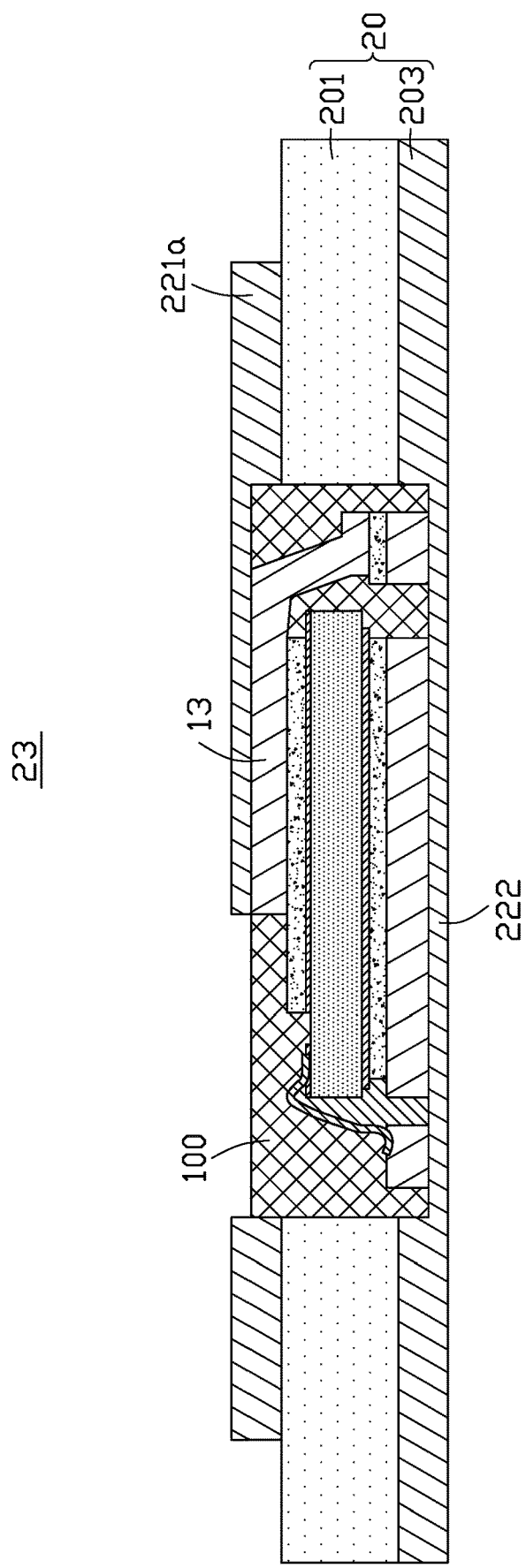
FIG. 6 is a cross-sectional view showing the third copper layer of FIG. 5 etched to form a packaging intermediate body.

At step S5, referring to FIG. 6, the first copper layer 202 and the third copper layer 221 are etched to form a first inner wiring layer 221*a*. Then, a packaging intermediate body 23 is obtained. A portion of the first inner wiring layer 221*a* is connected to the first frame 13.

In at least one embodiment, the first copper layer 202 and the third copper layer 221 may be etched by a development and exposure process.

Figure 7:
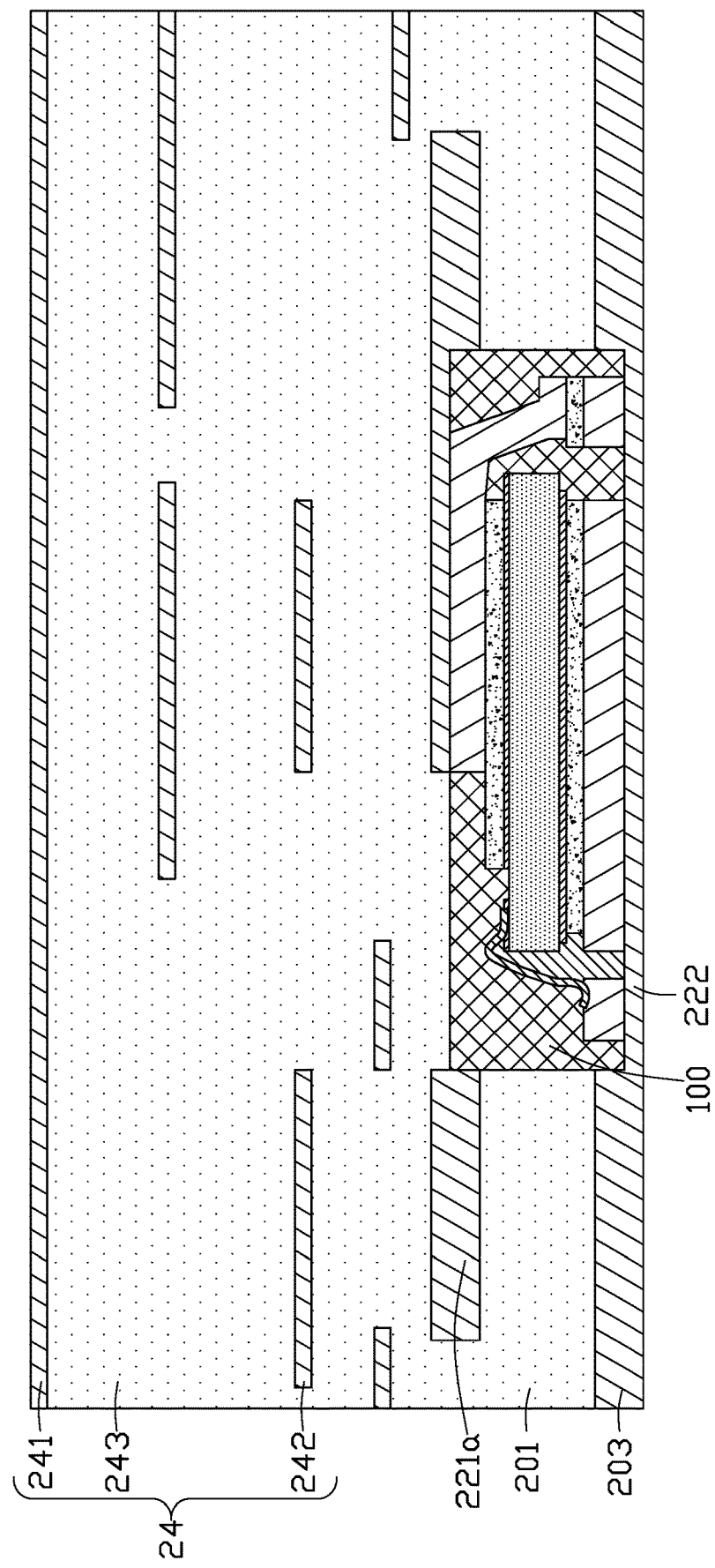
FIG. 7 is a cross-sectional view showing a multilayer circuit board formed on the packaging intermediate body of FIG. 6.

At step S6, referring to FIG. 7, a multilayered circuit board 24 is formed on the first inner wiring layer 221*a*. The multilayered circuit board 24 includes a fifth copper layer 241, a plurality of second inner wiring layers 242, and a plurality of second base layers 243. The second inner wiring layers 242 are disposed between the fifth copper layer 241 and the first inner wiring layer 221*a*. The second base layers 243 are disposed between two adjacent second inner wiring layers 242, between the first inner wiring layer 221*a* and the adjacent second inner wiring layer 242, and between the fifth copper layer 241 and the adjacent second inner wiring layer 242.

In other embodiments, the number of the wiring layers in the multilayered circuit board 24 may be changed. For example, a single-layered circuit board may be formed on the first inner wiring layer 221*a* at step S6.

Figure 8:
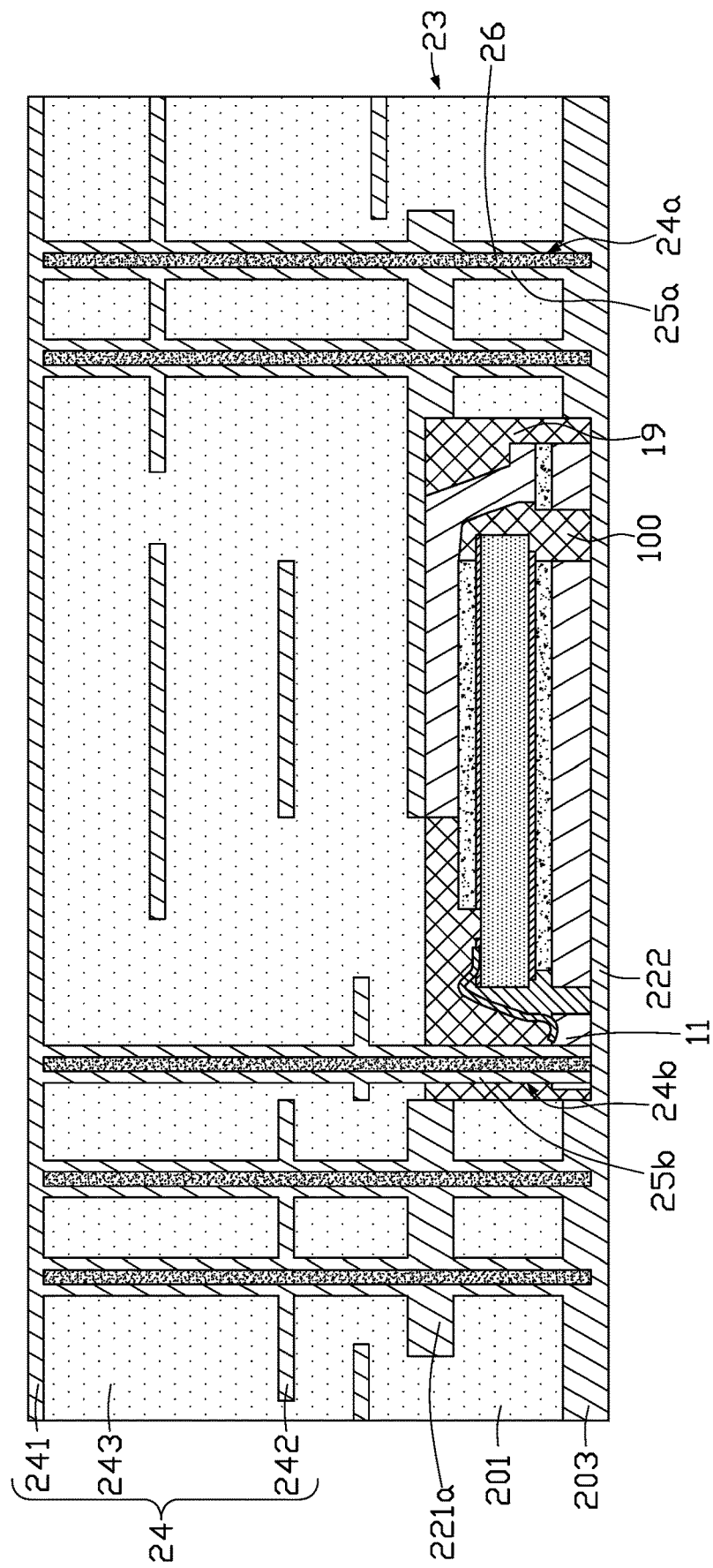
FIG. 8 is a cross-sectional view showing a conductive post formed in the packaging intermediate body and the multilayer circuit board of FIG. 7.

At step S7, referring to FIG. 8, a first through hole 24*a* and a second through hole 24*b* are defined in the multilayered circuit board 24 and the packaging intermediate body 23. The first through hole 24*a* penetrates the multilayered circuit board 24, the first inner wiring layer 221*a*, the first base layer 201, and the second copper layer 203. The second through hole 24*b* penetrates the multilayered circuit board 24, the first inner wiring layer 221*a*, the packaging body 19, and the second copper layer 203. The second through hole 24*b* is spaced apart from the power chip 10.

At step S8, referring to FIG. 8, a hollow first conductive post 25*a* is formed in the first through hole 24*a*, and a hollow second conductive post 25*b* is formed in the second through hole 24*b*. The first conductive post 25*a* is electrically connected to the fifth copper layer 241, the first inner wiring layer 221*a*, the second inner wiring layers 242, and the second copper layer 203. The second conductive post 25*b* is electrically connected to the second copper layer 203, the gate terminal 11, the second inner wiring layers 242, and the fifth copper layer 241.

In at least one embodiment, the first conductive post 25*a* and the second conductive post 25*b* may be formed by electroplating.

In at least one embodiment, after forming the first conductive post 25*a* and the second conductive post 25*b*, an insulating body 26 may further be filled in the first conductive post 25*a* and the second conductive post 25*b*. The insulating body 26 is used to discharge air in the first conductive post 25*a* and the second conductive post 25*b*.

Figure 9:
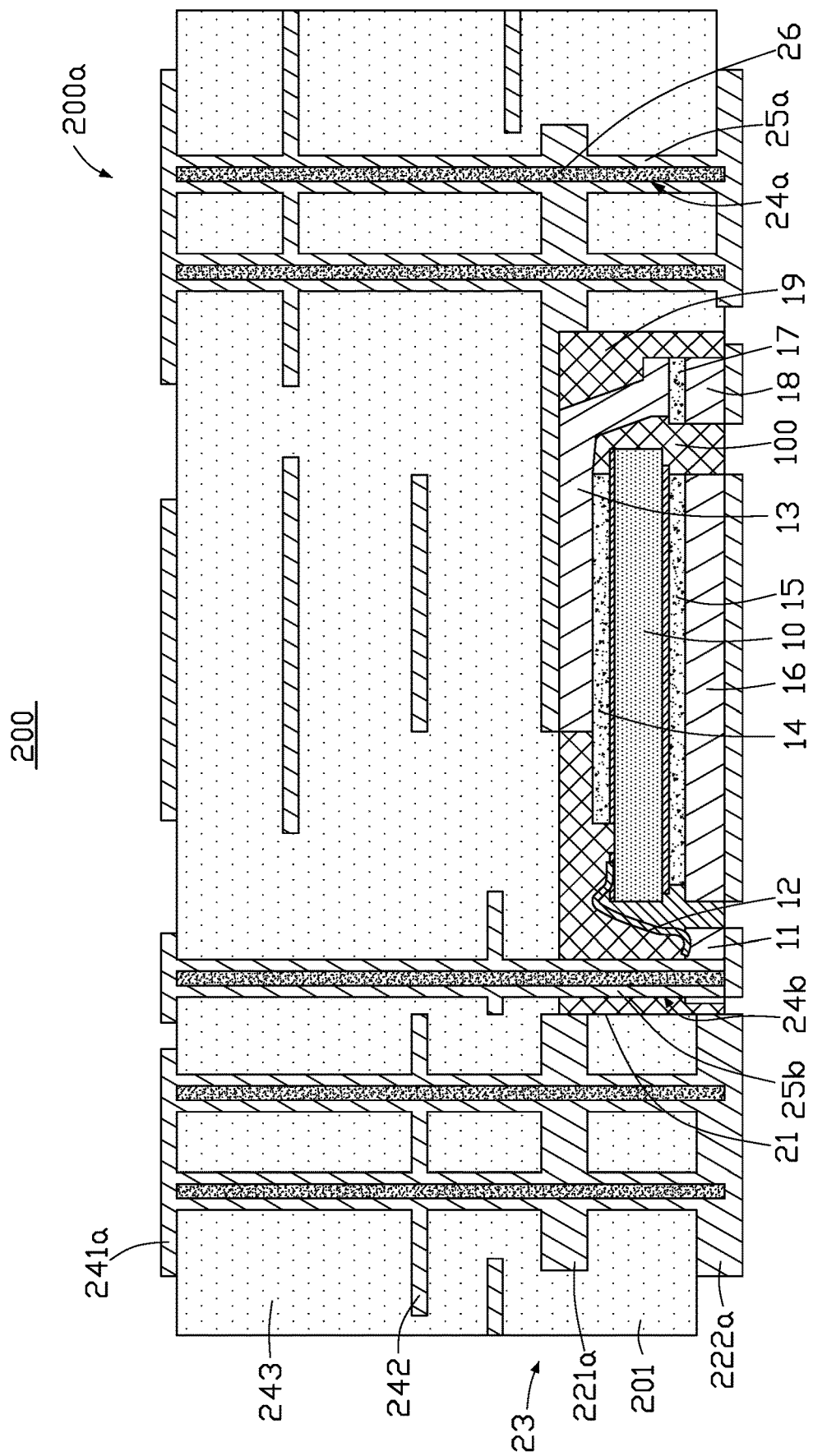
FIG. 9 is a cross-sectional view showing the fourth copper layer of FIG. 8 etched to form a circuit board module.

At step S9, referring to FIG. 9, the second copper layer 203 and the fourth copper layer 222 are etched to form a first outer wiring layer 222*a*. The fifth copper layer 241 is etched to form a second outer wiring layer 241*a*. Then, the circuit board module 200 is obtained.

Referring to FIG. 9, a circuit board module 200 is also provided according to an embodiment of a present disclosure. The circuit board module 200 includes the packaging structure 100 and a circuit board 200*a*.

The circuit board 200*a* includes a first base layer 201, a plurality of second base layers 243, a first inner wiring layer 221*a*, a plurality of second inner wiring layers 242, a first outer wiring layer 222*a*, and a second outer wiring layer 241*a*. The first inner wiring layer 221*a* is disposed between the first base layer 201 and the second base layers 243. The first outer wiring layer 222*a* is disposed on a surface of the first base layer 201 away from the first inner wiring layer 221*a*. The second outer wiring layer 241*a* is disposed on a surface of the second base layer 243 away from the first inner wiring layer 221*a*. The second inner wiring layers 242 are between the second outer wiring layer 241*a* and the first inner wiring layer 221*a*. The second base layers 243 are disposed between two adjacent second inner wiring layers 242, between the first inner wiring layer 221*a* and the adjacent second inner wiring layer 242, and between the fifth copper layer 241 and the adjacent second inner wiring layer 242.

A groove 21 is defined in the first base layer 201, and the packaging structure 100 is received in the groove 21. A portion of the first inner wiring layer 221*a* is connected to the first frame 13. A portion of the first outer wiring layer 222*a* is connected to the grid terminal 11, the source terminal 18, and the second frame 16.

In at least one embodiment, the circuit board module 200 further includes a hollow first conductive post 25*a* and a hollow second conductive post 25*n*. The first conductive post 25*a* electrically connects to the first inner wiring layer 221*a*, the second inner wiring layer 242, the first outer wiring layer 222a, and the second outer wiring layer 241a. The second conductive post 25b electrically connects to the second inner wiring layer 242, the gate terminal 11, the first outer wiring layer 222a, and the second outer wiring layer 241a. Thus, the circuit board 200a and the power chip 10 are electrically connected to each other. The first conductive post 25a and the second conductive post 25b further dissipates heat generated in the circuit board module 200p.

In the present disclosure, by controlling the surface size of the gate terminal 11 in the packaging structure 100, the position accuracy of the second conductive post 25b is increased, so as to improve the reliability of the circuit board module 200. In addition, since the second conductive post 25b penetrates the circuit board 200a and the grid terminal 11 of the packaging structure 100, an increase of parasitic inductance caused by connecting the circuit board 200a to the grid terminal 11 by wires is also avoided. Power loss is reduced, and power density and switching frequency are increased. The first conductive post 25a and the second conductive post 25b further dissipates heat generated in the circuit board module 200.

Figure 10:
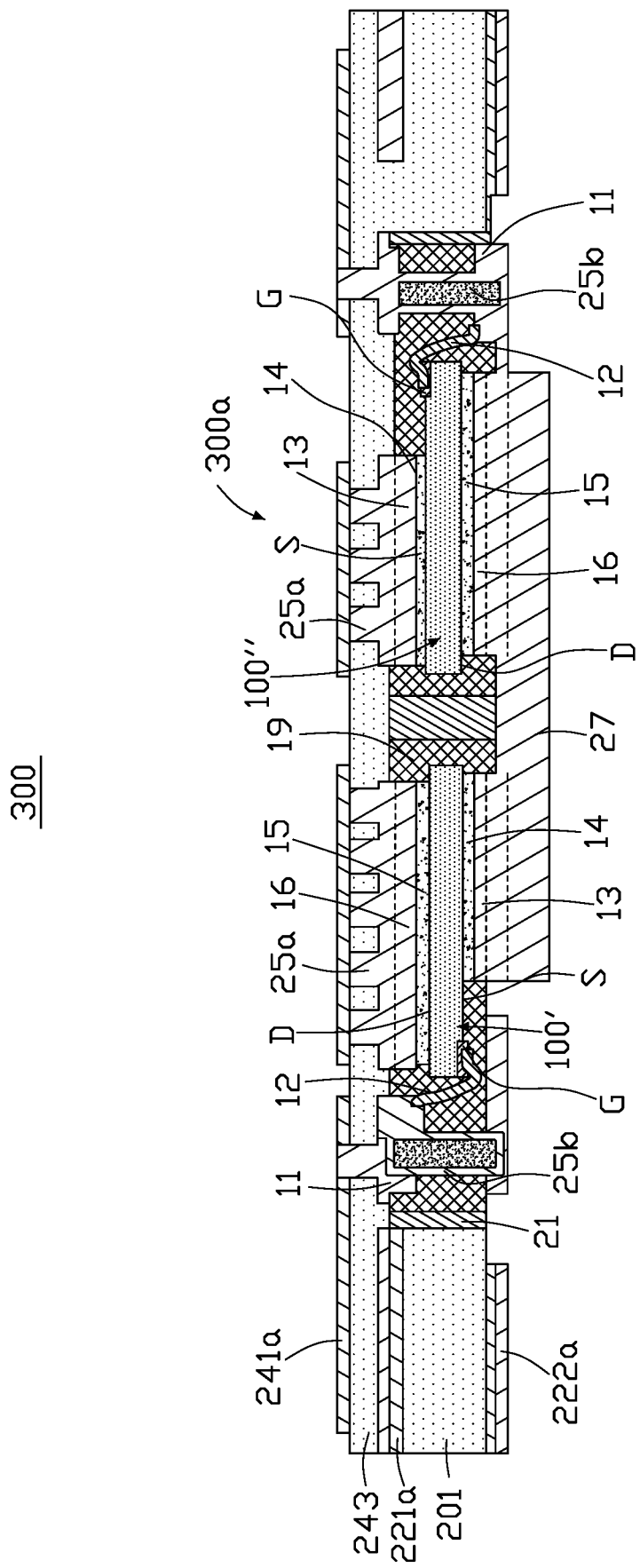
FIG. 10 is a cross-sectional view of a circuit board module according to another embodiment of the present disclosure.

Referring to FIG. 10, a circuit board module 300 is also provided according to an embodiment of the present disclosure. The circuit board module 300 includes a circuit board 300a and two packaging structures 100' and 100". Each of the packaging structures 100' and 100" can have a structure similar than that of the above-mentioned packaging structure 100, when the source terminal 18 may be omitted from the packaging structure 100' and 100".

The circuit board 300a is similar to the circuit board 200a, while the second inner wiring layers 242 are omitted from circuit board 300a. That is, the multilayered circuit board 24 formed on the first inner wiring layer 221a at step S6 can also be a single-layered circuit board. The first conductive post 25a penetrates the second base layer 243 and electrically connects to the second outer wiring layer 241a and the first inner wiring layer 221a. The first base layer 201 defines a groove 21. The two packaging structures 100' are both placed in the groove 21. The source electrode S of the packaging structure 100' and the drain electrode D of the packaging structure 100" face the first inner wiring layer 221a. That is, the packaging structures 100' and 100" have reverse orientations.

The gate terminal 11 and the second frame 16 of the packaging structure 100' are connected to the first inner wiring layer 221a. The first frame 13 of another one of the packaging structures 100" is connected to the first inner wiring layer 221a. The first frame 13 (i.e., the source terminal) of the packaging structure 100' is connected to the second frame 16 (i.e., the drain terminal) of the packaging structure 100" through the first outer wiring layer 222a. That is, the source electrode S of the packaging structure 100' is connected to the drain electrode D of the packaging structure 100".

The second conductive post 25b is formed in each of the packaging structures 100' and 100". The second conductive post 25b is electrically connected to the first outer wiring layer 222a, the gate terminal 11, the first inner wiring layer 221a, the first conductive post 25a, and the second outer wiring layer 241a.

In at least one embodiment, a heat dissipation element 27 may be formed on a portion of the first outer wiring layer 222a. The heat dissipation element 27 may correspond to the first frame 13 of the packaging structure 100' and the second frame 16 (i.e., the drain terminal) of the packaging structure 100". The heat dissipation element 27 dissipates heat generated in the packaging structures 100' and 100". The heat dissipation element 27 may include a copper layer, a copper block, or fins.

In the present disclosure, by arranging the packaging structures 100' and 100" with reverse orientations and electrically connecting the source electrode S of the packaging structure 100' and the drain electrode D of the packaging structure 100" through the first outer wiring layer 222a, a power density of the circuit board module 300 is improved.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A circuit board module, comprising:
    a circuit board comprising a first base layer, a first inner wiring layer, and a first outer wiring layer, the first inner wiring layer and the first outer wiring layer are formed on two opposite surfaces of the first base layer; the first base layer defines a groove; and
    a packaging structure received in the groove, the packaging structure comprising:
        a power chip comprising a grid electrode, a source electrode, and a drain electrode;
        a wire;
        a grid terminal connected to the grid electrode through the wire;
        a first soldering layer and a second soldering layer;
        a first frame connected to the source electrode through the first soldering layer;
        a second frame connected to the drain electrode through the second soldering layer; and
        a packaging body covering the power chip, the grid terminal, the first frame, the second frame, the wire, the first soldering layer and the second soldering layer;
    wherein a portion of the first inner wiring layer is connected to the first frame; a portion of the first outer wiring layer is connected to the grid terminal, the source terminal, and the second frame.

2. The circuit board module according to claim 1, wherein the circuit board further comprises a plurality of second base layers, a plurality of second inner wiring layers, and a second outer wiring layer; the plurality of the second base layers and the plurality of the second inner wiring layers are alternately arranged between the second outer wiring layer and the first inner wiring layer.

3. The circuit board module according to claim 2, further comprising a first conductive post and a second conductive post, wherein the first conductive post electrically connects to the first inner wiring layer, the second inner wiring layer, the first outer wiring layer, and the second outer wiring layer; the second conductive post electrically connects to the second inner wiring layer, the grid terminal, the first outer wiring layer, and the second outer wiring layer.

4. The circuit board module according to claim 3, wherein the second conductive post is hollow, the circuit board module further comprises an insulating body filled in the second conductive post.

5. The circuit board module according to claim 3, wherein the first conductive post is hollow, the circuit board module further comprises an insulating body filled in the first conductive post.

6. The circuit board module according to claim 1, wherein the packaging structure further comprises a source terminal and a third soldering layer, the source terminal is connected to the first frame through the third soldering layer; the packaging structure comprises a first surface and a second surface opposite to the first surface; the grid terminal, the source terminal, and the second frame are exposed from the second surface and covered by the first outer wiring layer.

7. The circuit board module according to claim 6, wherein the first frame is exposed from the first surface and covered by the first inner wiring layer.

\* \* \* \* \*